(12) United States Patent
Liaw

(10) Patent No.: US 6,413,803 B1
(45) Date of Patent: Jul. 2, 2002

(54) DESIGN AND PROCESS FOR A DUAL GATE STRUCTURE

(75) Inventor: Jhon-Jhy Liaw, Taipei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/425,905

(22) Filed: Oct. 25, 1999

(51) Int. Cl.[7] .......................... H01L 21/00; H01L 21/84
(52) U.S. Cl. ........................................ 438/157; 438/283
(58) Field of Search ................................. 438/157, 176, 438/180, 197, 199, 217, 231, 232, 233, 229, 301, 305, 306, 307, 663, 664, 682, 683, 283

(56) References Cited

U.S. PATENT DOCUMENTS

| | | | |
|---|---|---|---|
| 5,668,024 A | * 9/1997 | Tsai et al. | 438/199 |
| 5,674,775 A | 10/1997 | Ho et al. | 437/67 |
| 5,677,249 A | * 10/1997 | Fukui et al. | 438/586 |
| 5,900,658 A | * 5/1999 | Lee et al. | 257/296 |
| 6,174,775 B1 | * 1/2001 | Liaw | 438/283 |
| 6,207,482 B1 | * 3/2001 | Shih et al. | 438/199 |

* cited by examiner

*Primary Examiner*—Viet Q. Nguyen
*Assistant Examiner*—David Nhu
(74) *Attorney, Agent, or Firm*—George O. Saile; Stephen B. Ackerman

(57) ABSTRACT

A process for fabricating a polysilicon dual gate structure, featuring the use of a tungsten plug structure, used to alleviate the diode effect, present at the dopant interface in the polysilicon dual gate structure, has been developed. A first iteration of this invention places the tungsten plug, on a portion of a metal silicide layer, in a region directly overlying the dopant interface, (N type-P type regions), in the polysilicon dual gate structure. A second iteration of this invention places the tungsten plug directly on the dopant interface of the polysilicon dual gate structure, with the tungsten plug structure formed in a borderless opening, in an insulator layer. The use of the tungsten plug allows a less resistive current path through the polysilicon dual gate structure, when compared to counterparts fabricated without the tungsten plug structure, in which a more resistive current path, through a diode present at dopant interface, exists.

19 Claims, 7 Drawing Sheets

DESIGN AND PROCESS FOR A DUAL GATE STRUCTURE

BACKGROUND OF THE INVENTION

(1) Field of the Invention

The present invention relates to methods used to fabricate semiconductor devices, and more specifically to a method used to fabricate a dual gate structure, for a metal oxide semiconductor field effect transistor, (MOSFET), device, featuring a metal plug structure, formed at the N doped, and P doped regions, of a polysilicon dual gate structure.

(2) Description of Prior Art

To satisfy the low voltage, and low threshold voltage requirements, needed to reduce power consumption, and increase performance for ultra large scale integrated, (ULSI), devices, the semiconductor industry is using surface channel MOSFET devices, in place of buried channel counterparts. The polysilicon dual gate structure, used for both N channel, (NMOS), surface channel devices, and for P channel, (PMOS), surface channel devices, is comprised with N type doping, in the region of the dual gate structure which traverses the NMOS devices, and is comprised with P type doping, in regions in which the same dual gate structure traverses the PMOS devices. This dopant configuration, for the polysiicon dual gate structure, can however present a performance degrading, diode effect, at the interface between dopant regions in the polysilicon dual gate structure.

This invention will describe the use of a metal plug structure, formed overlying and contacting the region of the polysilicon dual gate structure, in which the dopant interface resides, alleviating the diode effect at the dopant interface by allowing the current flow, in the polysilicon dual gate structure, to pass through the less resistive metal plug structure. This invention will offer two process iterations, for forming the metal plug structure, in addition to describing the design of the dual gate structure, comprised with the metal plug structure. Prior art such as Lee et al, in U.S. Pat. No. 5,900,658, describe a process for forming both logic and memory MOSFET devices, on the same semiconductor chip, however that prior art does not describe the novel process and design, for fabricating a metal plug structure, to alleviate the diode effect, at the dopant interface, of a dual gate structure.

SUMMARY OF THE INVENTION

It is an object of this invention to fabricate a semiconductor device comprised with NMOS surface channel devices, and with PMOS surface channel devices.

It is another object of this invention to use a polysilicon dual gate structure, comprised with N type doping in the NMOS region of the semiconductor device, and comprised with P type doping in the PMOS region of the semiconductor device.

It is still another object of this invention to form a metal plug structure, to contact the portion of the polysilicon dual gate structure, in which the dopant interface exists.

It is still yet another object of this invention to form the metal plug structure on a metal silicide layer, in a region in which the metal silicide layer overlays the dopant interface, or to form the metal plug structure, directly on the dopant interface, in the polysilicon dual gate structure, with the metal plug structure located in an opening formed using self-aligned contact procedures.

In accordance with the present invention a process for forming a metal plug, on a polysilicon dual gate structure, with the metal plug located on the dopant interface of the polysilicon dual gate structure, is described. A first iteration of this invention entails forming the metal plug structure, on a metal silicide layer, in a region in which the metal silicide layer overlays the dopant interface, in the polysilicon dual gate structure. After formation of an undoped, polysilicon dual gate structure, on an underlying gate insulator layer, a first photoresist shape is used to block out PMOS regions, allowing a first ion implantation procedure to form a N type, lightly doped source/drain region, in an NMOS region. A second photoresist shape is then employed to block out NMOS regions from a second ion implantation procedure, used to form a P type, lightly doped source/drain region, in PMOS regions. After formation of insulator spacers, on the sides of the polysilicon dual gate structure, a third photoresist shape is used to block out PMOS regions from a third ion implantation procedure, used to create an N type, heavily doped source/drain, in the NMOS region, in addition to forming a N type region, in the portion of the polysilicon dual gate structure, located in the NMOS region. A fourth photoresist shape is next used to block out the NMOS regions, allowing a fourth ion implantation procedure to create a P type, heavily doped source/drain region, in the PMOS region, as well as creating a P type region, in the portion of the polysilicon dual gate structure, residing in the PMOS region. After formation of a metal silicide layer, on the top surface of all heavily doped source/drain regions, as well as on the top surface of the polysilicon dual gate structure, an interlevel dielectric, (ILD), layer is deposited, and planarized. Conventional photolithographic and reactive ion etching, (RED), procedures are used to create openings in the ILD layer, exposing portions of the metal silicide layer: directly overlying: the N type region, and the P type region of the polysilicon dual gate structure; directly overlying the N type, and P type, heavily doped source/drain regions; and directly overlying the dopant interface in the polysilicon dual gate structure. Metal plug structures are next formed in all openings, followed by the formation of metal interconnect structures, overlying and contacting all metal plug structures, except the metal plug structure, that overlaysthe dopant interface of the polysilicon dual gate structure.

A second iteration of this invention entails initially creating the N type, and P type regions, in a polysilicon layer, followed by the deposition of a first silicon nitride layer. After definition of a silicon nitride capped, polysilicon dual gate structure, the sequence of photoresist block out masks, and ion implantation procedures, and insulator spacer formation, used with the first iteration, are again used to create the N type, lightly doped, and N type, heavily doped source/drain regions, in the NMOS region, while P type, lightly doped, and P type heavily doped source/drain regions, are created in the PMOS regions. A second silicon nitride layer is next deposited, followed by the creation of openings in the silicon nitride layers, exposing regions of the polysilicon dual gate structure to be subsequently overlaid by metal plug structures. After deposition and planarization of an ELD layer, borderless, or self-aligned openings, are created in the ILD layer, aligned with the openings in the silicon nitride layer, exposing a portion of the top surface of the N type region, and the P type region, in the polysilicon dual gate structure; the heavily doped source/drain regions; and of the dopant interface in the polysilicon dual gate structure. Metal plug structures are next formed in the self aligned openings, followed by the creation of metal interconnect structures, overlying, and contacting, all metal plug structures, except the metal plug structure, located on the dopant interface of the polysilicon dual gate structure.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1A:
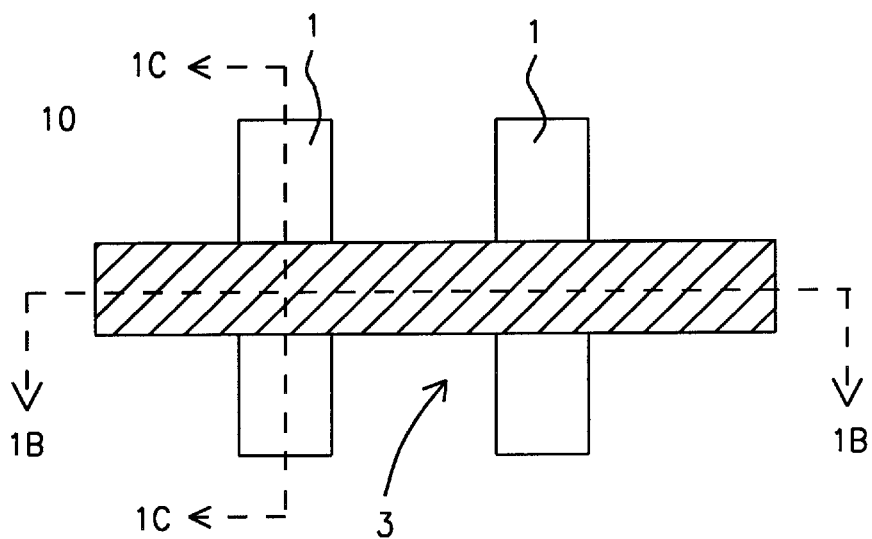
FIGS. 1A, 6A, and 11A, which schematically show the top view of the metal plug, at key stages of fabrication.
Figure 1B:
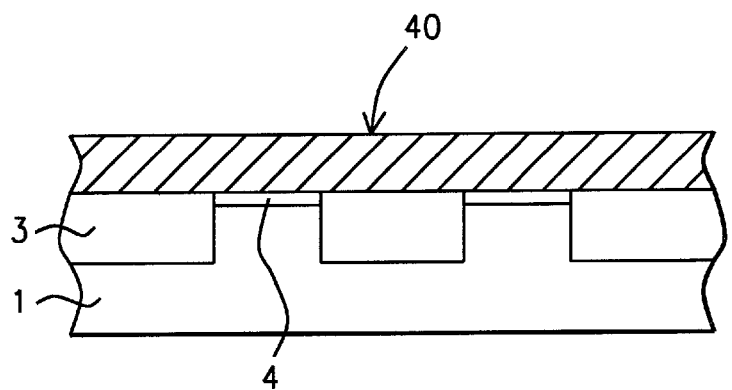
FIGS. 1B, 1C, 2–5, 6B, 7–10, and 11B, which schematically in cross-sectional style, show key stages of fabrication, used to create a metal plug structure, on the dopant interface of a polysilicon dual gate structure.
Figure 1C:
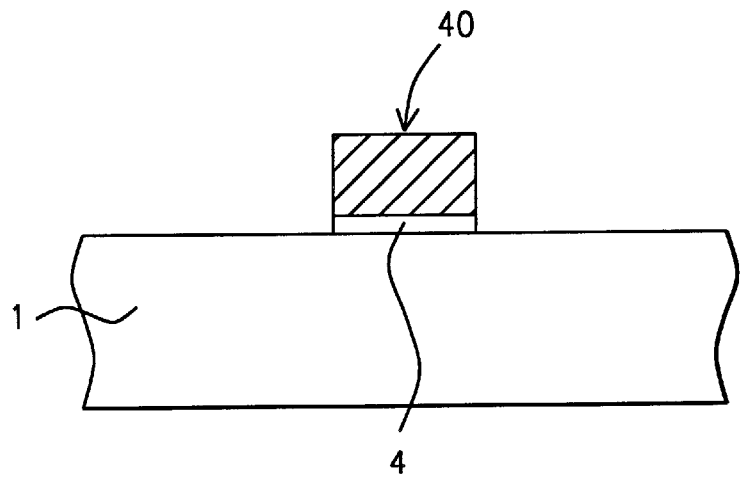

The method of forming a metal plug structure, located on the dopant interface of a polysilicon dual gate structure, will now be described in detail. A semiconductor substrate 1, comprised of single crystalline silicon, with a <100> crystallographic orientation is used, and schematically shown in FIG. 1B. Insulator isolation regions 3, comprised of either thermally grown, silicon dioxide, field oxide regions, at a thickness between about 2500 to 5000 Angstroms, or insulator filled shallow trench regions, filled with silicon oxide, at a shallow trench depth between about 2500 to 5000 Angstroms, are next formed, followed by the growth of gate insulator layer 4, obtained via thermal oxidation procedures, at a thickness between about 50 to 250 Angstroms. An intrinsic polysilicon layer is next deposited via low pressure chemical vapor deposition, (LPCVD), procedures, to a thickness between about 500 to 2500 Angstroms, using silane as a source. Conventional photolithographic and anisotropic RIE procedures are then employed to define polysilicon dual gate structure 40, schematically shown in cross-sectional style, in FIGS. 1B and 1C, and shown as a top view in FIG. 1A. Polysilicon dual gate structure 40, has a width between about 1000 to 5000 Angstroms. The photoresist shape used for definition of polysilicon dual gate structure 40, is removed via plasma oxygen ashing and careful wet cleans.

Figure 2:
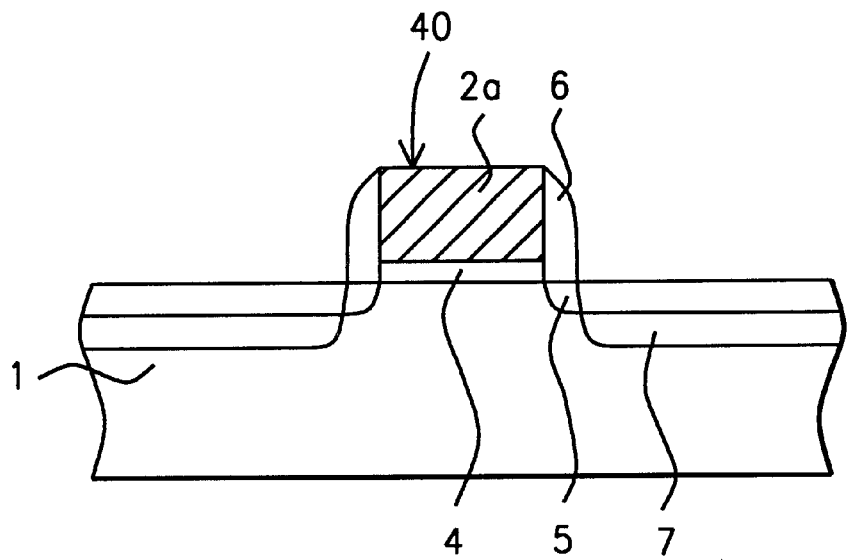
Figure 3:
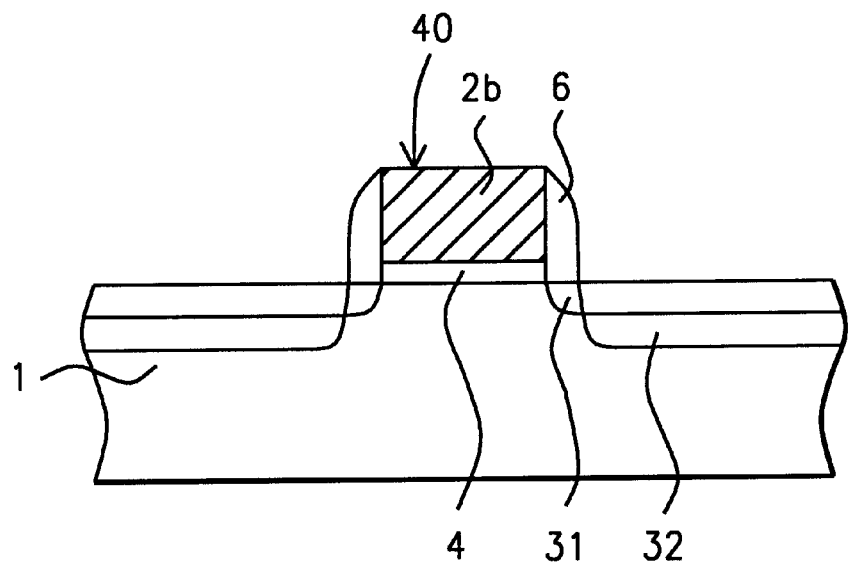

The formation of the lightly doped, and heavily doped source/drain regions, the formation of insulator spacers on the sides of the polysilicon dual gate structure, and the creation of the N type region, as well as the P type regions, in polysilicon dual gate structure 40, will next be described, and shown using FIGS. 2–3. A first photoresist shape is used to block out PMOS regions, from a first ion implantation procedure, used to create N type, lightly doped source/drain region 5, in an NMOS region. This is shown schematically in FIG. 2. First ion implantation procedure, used to form N type, lightly doped source/drain region 5, is performed using arsenic or phosphorous ions at an energy between about 1 to 40 KeV, and at a dose between about 1E12 to 1E15 atoms/$cm^2$. After removal of the first photoresist shape, via plasma oxygen ashing and careful wet cleans, a second photoresist shape is used to block out NMOS regions, from a second ion implantation procedure; used to create P type, lightly doped source/drain region 31, in a PMOS region. This is shown schematically in FIG. 3. Second ion implantation procedure, used to create P type, lightly doped source/drain region 31, is performed using boron or $BF_2$ ions, at an energy between about 1 to 40 KeV, and at a dose between about 5E12 to 1E15 atoms/$cm^2$. After removal of the second photoresist shape, via plasma oxygen ashing and careful wet cleans, insulator spacers 6, schematically shown in FIGS. 2–3, are formed on the sides of polysilicon dual gate structure 40. Insulator spacers 6, comprised of either silicon oxide, or silicon nitride are formed via deposition of either silicon oxide, or silicon nitride, using LPCVD or plasma enhanced chemical vapor deposition, (PECVD), procedures, at a thickness between about 1000 to 3000 Angstroms, followed by a blanket, anisotropic RIE procedure, using $CHF_3$ or $CF_4$ as an etchant.

A third photoresist shape is again used to block out the PMOS region, from a third ion implantation procedure, used to form N type, heavily doped source/drain region 7, in the NMOS region, as well as doping the exposed region of polysilicon dual gate structure 40, creating N type region 2a, in the region where polysilicon dual gate structure 40, resides in the NMOS region. This is shown schematically in FIG. 2. The third ion implantation procedure is performed using arsenic or phosphorous ions, at an energy between about 5 to 80 KeV, at a dose between about 1E15 to 1E16 atoms/$cm^2$. After removal of the third photoresist shape, using plasma oxygen ashing and careful wet cleans, a fourth photoresist shape is used to block out the NMOS region, from a fourth ion implantation procedure, used to create P type, heavily doped source/drain region 32, in the PMOS region, in addition to creating P type region 2b, in the region of polysilicon dual gate structure 40, residing in the PMOS region. This is again shown schematically in FIG.3. The fourth ion implantation procedure is performed using boron or $BF_2$ ions, at an energy between about 2 to 60 KeV, and at a dose between about 1E15 to 1E16 atoms/$cm^2$, The fourth photoresist shape is then removed via plasma oxygen ashing and careful wet cleans.

Figure 4:
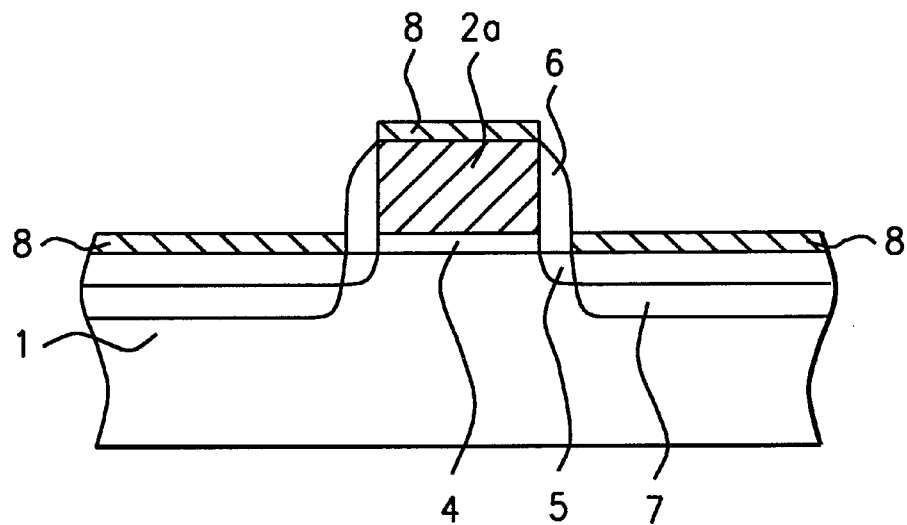

A metal silicide layer 8, such as titanium silicide, shown schematically in FIG. 4, is next formed on the heavily doped source/drain regions, as well as on the top surface of polysilicon dual gate structure 40. This is accomplished via initially depositing a metal layer, such as titanium, via R.F. sputtering, to a thickness between about 100 to 500 Angstroms, followed by a first anneal procedure, performed using either conventional furnace, or rapid thermal anneal, (RTA), procedures, resulting in the formation of titanium silicide 8, on regions of exposed silicon or polysilicon, while the titanium remains unreacted in regions overlying insulator spacers 6. The first anneal procedure, if an RTA procedure is used, is performed at a temperature between about 600 to 750° C., for a time between about 10 to 90 sec, in a nitrogen ambient. Selective removal of unreacted titanium is achieved using 1:1:1 solution of $H_2O_2$—$NH_4OH$—$H_2O$, at room temperature, or using a 1:1:5 solution of $H_2O_2$—$NH_4OH$—$H_2O$, at a temperature between about 70 to 80° C. If desired a second anneal procedure can be performed to reduce the resistance of titanium silicide layer 8. This can again be performed using RTA procedures, at a temperature between about 750 to 950° C., for a time between about 10 to 90 sec.

Figure 5:
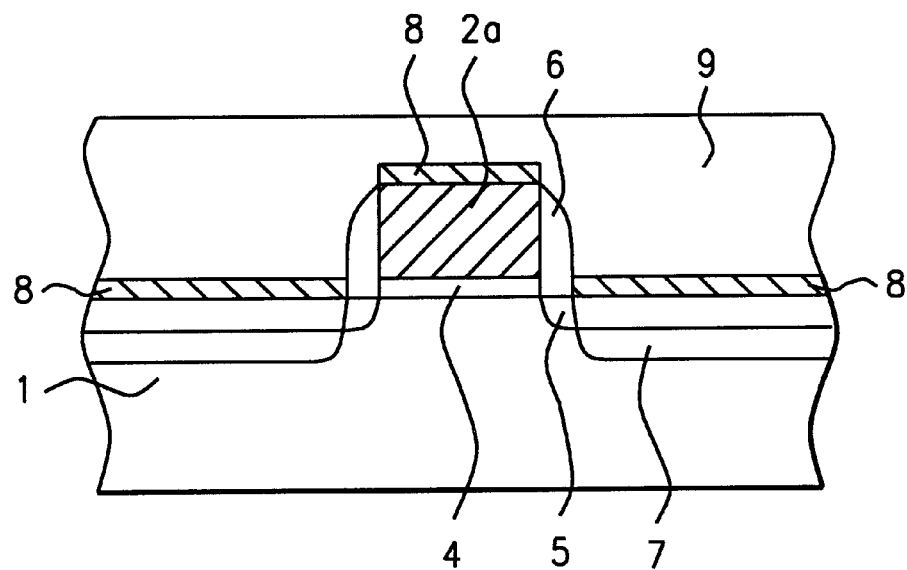
Figure 6A:
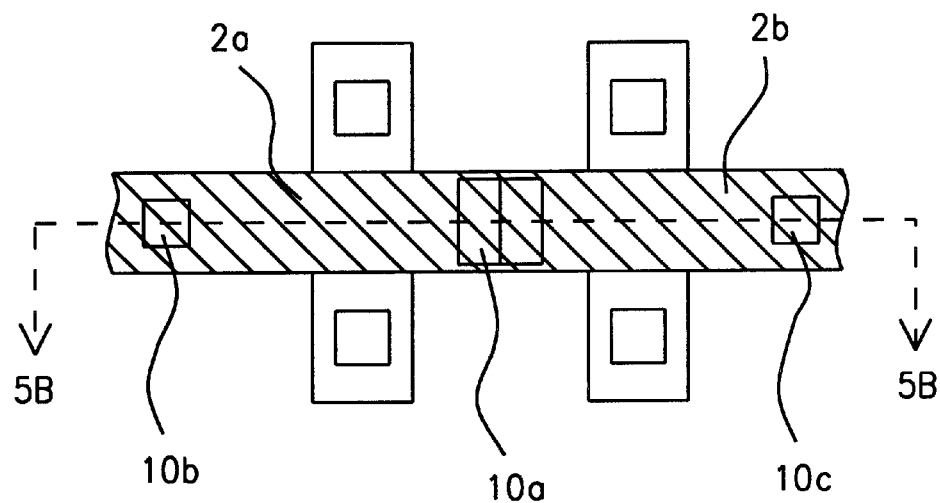
Figure 6B:
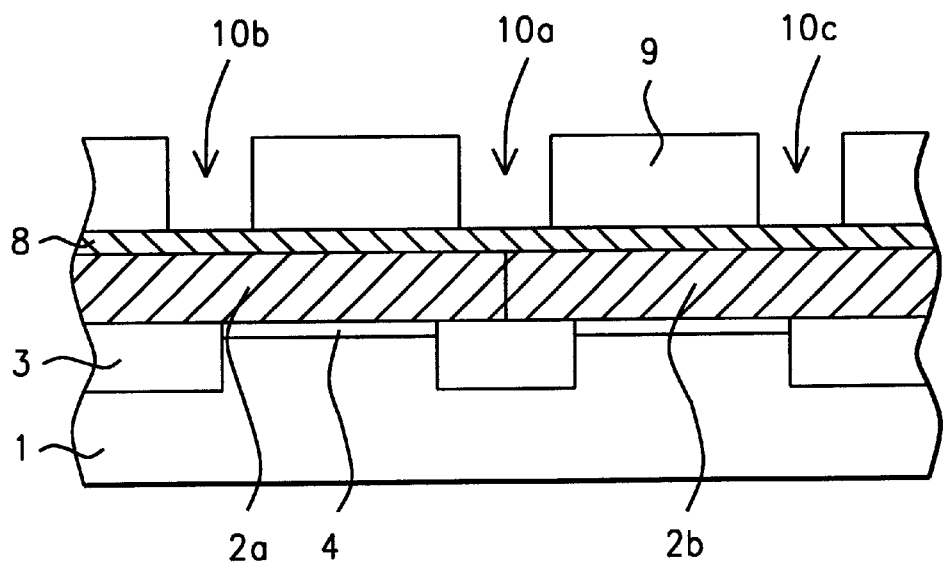

An interlevel dielectric, (WLD), layer 9, comprised of either silicon oxide, or borophosphosilicate glass, (BPSG), is next deposited, using either LPCVD or PECVD procedures, to a thickness between about 5000 to 15000 Angstroms. A chemical mechanical polishing, (CMP), procedure, is then employed to create a smooth top surface topography for ILD layer 9. This is schematically shown in FIG. 5. Conventional photolithographic and anisotropic RIE procedures, using $CHF_3$ as an etchant, are next used to create opening 10b, and opening 10c, exposing a portion of the top surface of metal silicide layer 8, in a region overlying N type region 2a, and exposing a portion of the top surface metal silicide layer 8, in a region overlying P type region 2b, in polysilicon dual gate structure 40. In addition opening 10a, is formed exposing a portion of the top surface metal silicide layer 8, in a region directly overlying the dopant interface, or the interface of N type region 2a and P type region 2b, in polysilicon dual gate structure 40. Opening 10a, is created with a diameter between about 1500 to 6000 Angstroms. This is schematically shown, in cross-sectional form in FIG. 6B. In addition to openings 10a, 10b, and 10c, openings are also formed to portions of the metal silicide layer, overlying the heavily doped source and drain regions. This is schematically shown, as a top view in FIG. 6A. The photoresist shape, used for definition of the above openings, is removed again via plasma oxygen ashing and careful wet cleans.

Figure 7:
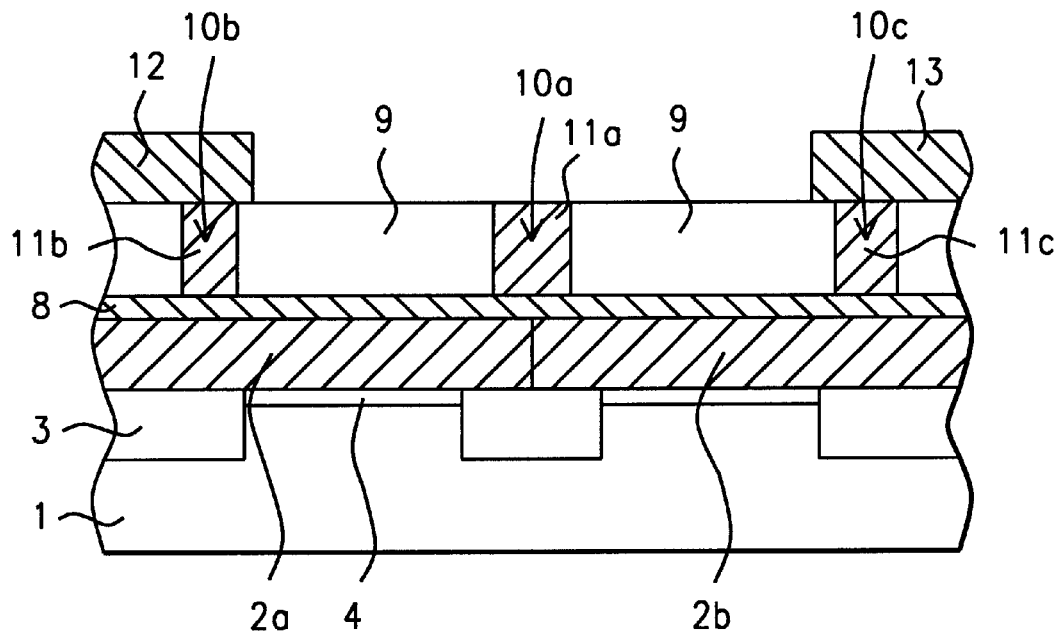

The formation of metal plug structures 11A, 1B, and 11c, are next addressed, and schematically shown in FIG. 7. A tungsten layer is deposited, via LPCVD procedures, to a thickness between about 3000 to 6000 Angstroms, using tungsten hexafluoride as a source, completely filling openings 10a, 10b, and 10c. Removal of unwanted tungsten, from the top surface of ILD layer 9, is accomplished either via a CMP procedure, or via a selective RIE procedure, using $Cl_2$ or $SF_6$ as an etchant. Tungsten plug structure 11a, is located on a portion of titanium silicide layer 8, in a region directly overlying the dopant interface in polysilicon dual gate structure 40. Metal interconnect structures, shown schematically in FIG. 7, are formed only overlying tungsten plug structures 11b, and 11c. Tungsten plug structure 11a, located at the dopant interface, in polysilicon dual gate structure 40, now allows a less resistive path for word line current to pass through, than existed when the same current had to traverse the word line, comprised with the diode formed at dopant interface, of the polysilicon dual gate structure. Metal interconnect structures 12, and 13, shown overlying and contacting tungsten plug structures 10b, and 10c, respectfully, can be comprised of aluminum, aluminum—copper, or of tungsten.

Figure 8:
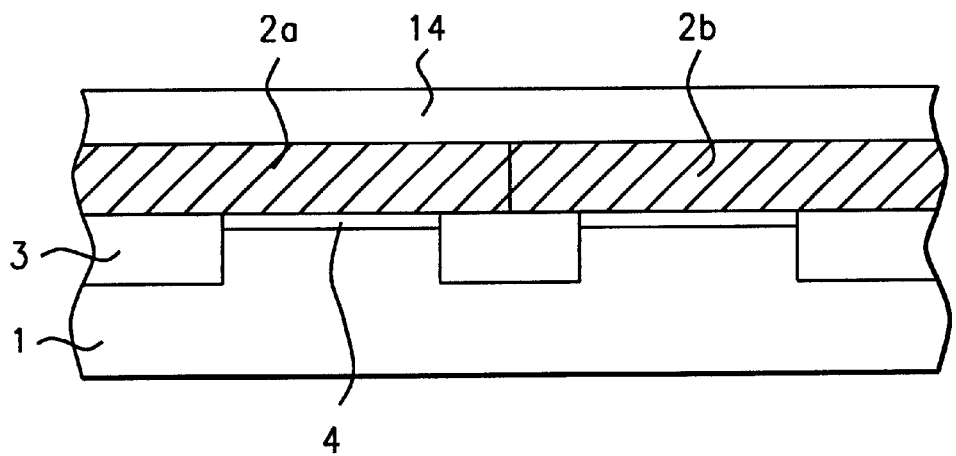

A second iteration of this invention is next addressed, featuring the formation of a tungsten plug structure, in a self-aligned opening. The self-aligned, or borderless opening, reduces the consequence of mis-alignment of the opening, to the polysilicon dual gate structure. A polysilicon layer is again deposited on an underlying gate insulator layer 4, via LPCVD procedures, to a thickness between about 1000 to 3000 Angstroms. A first photoresist shape is then employed to protect PMOS regions, from a first ion implantation procedure, applied to regions of the polysilicon layer, to be used in the NMOS regions of the semiconductor chip. The first ion implantation procedure, performed using arsenic or phosphorous ions at an energy between about 5 to 50 KeV, and at a dose between about 1E15 to 1E16 atoms/$cm^2$, results in the creation of N type region 2a, in the portion of the polysilicon layer to be used for NMOS devices. This is schematically shown in FIG. 8. After removal of the first photoresist shape, used to form N type region 2a, in the polysilicon layer, a second photoresist shape is formed, protecting N type region 2a, from a second ion implantation procedure, performed using boron, or $BF_2$ ions, at an energy between about 2 to 50 KeV, and at a dose between about 1E15 to 1E16 atoms/$cm^2$, resulting in the formation of P type region 2b, in regions of the polysilicon layer, residing in PMOS regions. After removal of the second photoresist shape, via plasma oxygen ashing and careful wet cleans, first silicon nitride layer 14, is deposited via LPCVD or PECVD procedures, to a thickness between about 1500 to 3000 Angstroms. This is schematically shown in FIG. 8.

Figure 9:
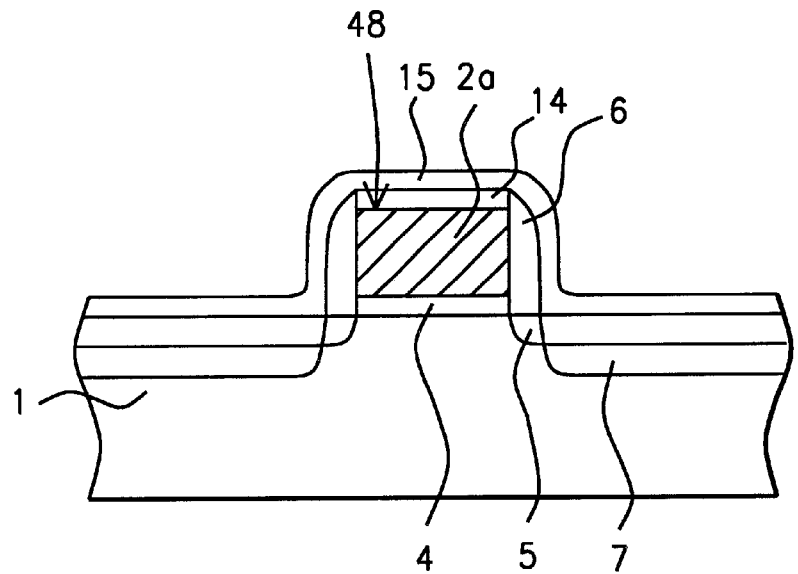

Conventional photolithographic and anisotropic R1E procedures, using $CF_4$ as an etchant for first silicon nitride layer 14, and for the polysilicon layer, comprised with N type region 2a, and P type region 2b, are used to create a silicon nitride capped, polysilicon dual gate structure 48, with a width between about 1000 to 5000 Angstroms. FIG. 9, schematically shows a cross-sectional view of silicon nitride capped, polysilicon dual gate structure 48, in the NMOS region, where the polysilicon dual gate structure is comprised with N type region 2a. The sequence of photoresist block out shapes, and ion implantation procedures, used in the first iteration of this invention, are again used to create N type, lightly doped source/drain region 5, in the NMOS region, and to create a P type, lightly doped source/drain region, (not shown in the drawings), in the PMOS region. After removal of the photoresist shapes, used as block out masks for the lightly doped source/drain regions, insulator spacers 6, comprised of either silicon oxide or silicon nitride, are again formed on the sides of silicon nitride capped, polysilicon dual gate structure 48, using deposition and etching procedures, identical to procedures previously described in the first iteration. Another sequence of block out shapes, and ion implantation procedures, are used to create the N type, heavily dopes source/drain region 7, in the NMOS region, and to create a P type, heavily doped source/drain region, (not shown in the drawings), in the PMOS region. The ion implantation procedures used for the heavily doped source/drain regions; are identical to the conditions used to create the heavily doped source/drain regions, in the first iteration of this invention. However unlike the first iteration the doping of the polysilicon dual gate structure, in the second iteration of this invention was accomplished prior to the heavily doped source/drain procedures. Silicon nitride layer 14, located on polysilicon dual gate structure 48, prevents implanted ions from reaching the polysilicon dual gate structure. A second silicon nitride layer 15, shown schematically in FIG. 9, is next deposited, via LPCVD or PECVD procedures, at a thickness between about 150 to 600 Angstroms.

Figure 10:
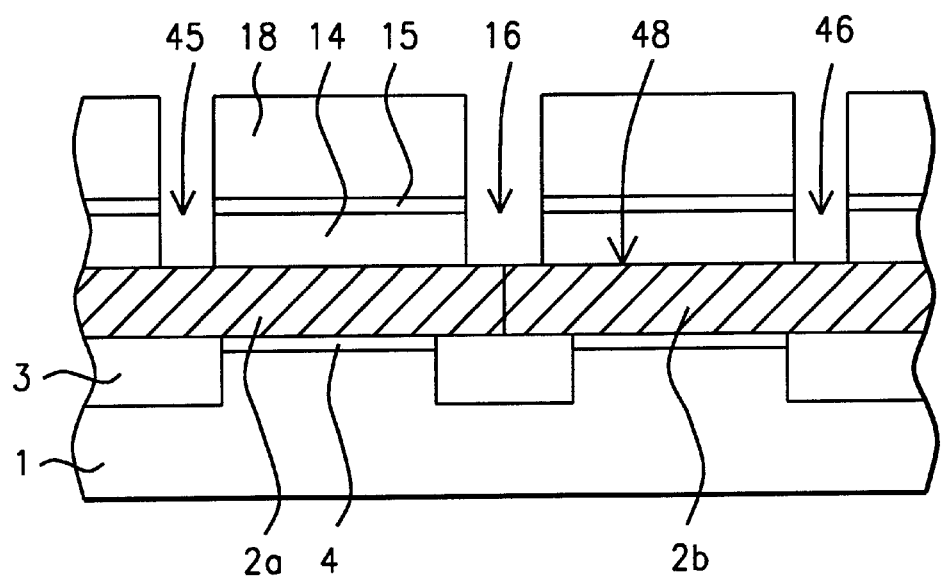

A photolithographic and selective RIE procedure, using $CF_4$ as an etchant, are next used to remove portions of silicon nitride layer 15, and silicon nitride layer 14, from portions of the top surface of polysilicon dual gate structure 48, in areas in which subsequent metal plug structures will overlay, and contact, regions of polysilicon dual gate structure 48. After removal of the photoresist shape used for definition of the openings in the silicon nitride layers, ILD layer 18, comprised of either silicon oxide, or BPSG, is deposited via LPCVD or PECVD procedures, to a thickness between about 5000 to 15000 Angstroms, followed by a CMP procedure, used for planarization purposes, resulting in a smooth top surface topography. Another photolithographic, and selective R1E procedure, using $CHF_3$ as an etchant for ILD layer 18, is used to create opening 16, exposing the dopant interface, in polysilicon dual gate structure 48, comprised of the interface of N type region 2a, and P type region 2b. Opening 16, with a diameter between about 1500 to 6000 Angstroms, is a borderless, or self-aligned opening, using silicon nitride layer 15, as a possible etch stop, during the selective RIE procedure, if opening 16, was mis-aligned to the openings in silicon nitride layer 15, and silicon nitride layer 14. Openings 45, and 46, exposing portions of the top surface of N type region 2a, and P type region 2b, respectfully, in polysilicon dual gate structure 48, are also formed with the procedures used for creation of opening 16. This is schematically shown in FIG. 10. The photoresist shape, used for definition of openings 16, 45, and 46, is removed using plasma oxygen ashing and careful wet cleans.

Figure 11A:
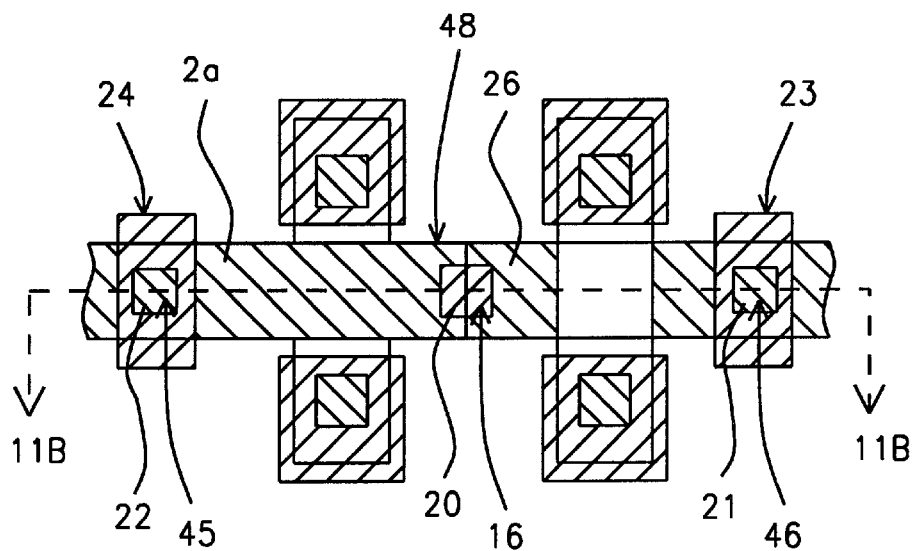
Figure 11B:
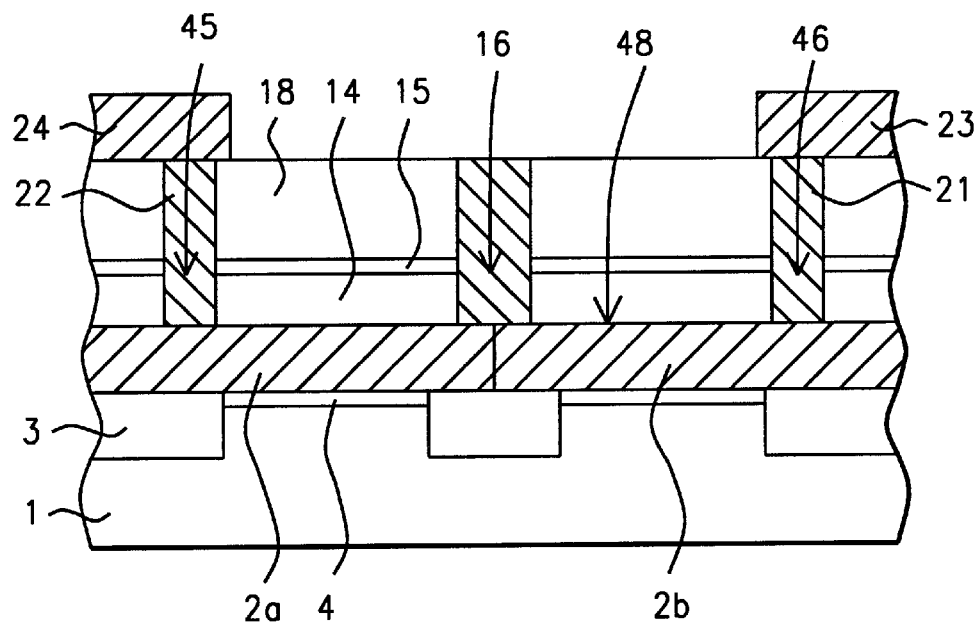

Metal plug structures 20, 21, and 22, are next formed in openings 16, 46, and 45, respectfully, using the identical material, tungsten, and processes, previously described in the first iteration of this invention. In addition metal interconnect structures 23, and 24, are then formed overlying, and contacting metal plug structures 21, and 22, using identical materials, such as aluminum, aluminum—copper, or tungsten, and identical processes, previously described in the first iteration of this invention. This is schematically shown, in cross-sectional style, in FIG. 1B, and as a top view in FIG. 11A. Again, as was the case in the first iteration, the metal, or tungsten plug structure, located on the dopant interface of polysilicon dual gate structure 48, allows a path of least resistance for current through the polysilicon dual gate structure, avoiding the more resistive diode, present at the dopant interface, in the polysilicon dual gate structure.

While this invention has been particularly shown and described with reference to, the preferred embodiments thereof, it will be understood by those skilled in the art that various changes in form and details may be made without departing from the spirit and scope of this invention.

What is claimed is:

1. A method of forming a metal plug structure, on a semiconductor substrate, with the metal plug structure overlaying a portion of a dopant interface, located in a polysilicon dual gate structure, comprising the steps of:

forming said polysilicon dual gate structure, on an underlying gate insulator lay and forming insulator spacers on the sides of said polysilicon dual gate structure, performing a first ion implantation procedure to create N type, heavily doped source/drain regions in a first region of said semiconductor substrate, and to form an N type region in a first portion of said polysilicon dual gate structure, which is located in said first region of said semiconductor substrate;

performing a second ion implantation procedure to create P type, heavily doped source/drain regions in a second region of said semiconductor substrate, and to form a P type region in a second portion of said polysilicon dual gate structure, which is located in said second region of said semiconductor substrate;

forming a metal silicide layer on the top surface of said polysilicon dual gate structure;

depositing an insulator layer, forming an opening in said insulator layer to expose a portion of said metal silicide layer, in a region in which said metal silicide layer directly overlays said dopant interface, of said N type region, and said P type region, in said polysilicon dual gate structure; and forming said metal plug structure in said opening.

2. The method of claim 1, wherein the thickness of said polysilicon dual gate structure is between about 500 to 2500 Angstroms, and with a width, for said polysilicon gate structure of between about 1000 to 5000 Angstroms.

3. The method of claim 1, wherein said insulator spacers are comprised of silicon oxide, or silicon nitride, at a thickness between about 1000 to 3000 Angstroms.

4. The method of claim 1, wherein said first ion implantation procedure, used to create said N type, heavily doped source/drain regions, in said first region of said semiconductor substrate, and to create said N type region, in said first portion of said polysilicon dual gate structure, is performed using arsenic, or phosphorous ions, at an energy between about 5 to 80 KeV, at a dose between about 1E15 to 1E16 atoms/cm$^2$.

5. The method of claim 1, wherein said second ion implantation procedure, used to create said P type, heavily doped source/drain regions, in said second region of said semiconductor substrate, and to create said P type region, in said second portion of said polysilicon dual gate structure, is performed using boron, or BF$_2$ ions, at an energy between about 2 to 60 KeV, at a dose between about 1E15 to 1E16 atoms/cm$^2$.

6. The method of claim 1, wherein said metal silicide layer, is a titanium silicide layer.

7. The method of claim 1, wherein said insulator layer is a silicon oxide layer, or a borophosphosilicate layer, obtained via LPCVD or via PECVD procedures, at a thickness between about 5000 to 15000 Angstroms.

8. The method of claim 1, wherein said opening, in said insulator layer, is formed via an anisotropic RIE procedure, using CHF$_3$ as an etchant, with said opening formed with a diameter between about 1500 to 6000 Angstroms.

9. The method of claim 1, wherein said metal plug structure is comprised of tungsten.

10. A method of forming a metal plug structure, on a semiconductor substrate, with said metal plug structure formed in a borderless contact opening, in an insulator layer, and with said metal plug structure contacting a portion of a dopant interface region, in a polysilicon dual gate structure, comprising the steps of:

providing a polysilicon layer, on an underlying gate insulator layer;

forming an N type region, in a first portion of said polysilicon layer, in a region in which said polysilicon layer resides in a first region of said semiconductor substrate;

forming a P type region, in a second portion of said polysilicon layer, in a region in which said polysilicon layer resides in a second region of said semiconductor substrate;

depositing a first silicon nitride layer;

patterning of said first silicon nitride layer, and of said polysilicon layer, to create a silicon nitride capped, polysilicon dual gate structure, comprised with said N type region, in a first portion of said silicon nitride capped, polysilicon dual gate structure, and comprised with a P type region, in a second portion of said silicon nitride capped, polysilicon dual gate structure;

forming insulator spacers on the sides of said silicon nitride capped, polysilicon dual gate structure;

forming N type, heavily doped source/drain regions, in an area of said first region of said semiconductor substrate, not covered by said silicon nitride capped, polysilicon dual gate structure, and forming P type, heavily doped source/drain regions, in an area of said second semiconductor substrate, not covered by said silicon nitride capped, polysilicon dual gate structure;

depositing a second silicon nitride layer;

forming a first opening in said second silicon nitride, and in said first silicon nitride layer, exposing a portion of said dopant interface, between said N type region, and said P type region, located in said silicon nitride capped, polysilicon dual gate structure, depositing an interlevel dielectric, (ILD), layer;

forming a borderless opening, in said ILD layer, exposing said dopant interface, in said silicon nitride capped, polysilicon dual gate structure, exposed in said first opening; and forming said metal plug structure, in said borderless opening, with said metal plug structure, contacting said dopant interface, in said silicon nitride capped, polysilicon dual gate structure.

11. The method of claim 10, wherein said polysilicon layer is obtained via LPCVD procedures, at a thickness between about 1000 to 3000 Angstroms.

12. The method of claim 10, wherein said N type region, located in said first portion of said polysilicon layer, is formed via ion implantation of arsenic, or phosphorous ions, at an energy between about 5 to 50 KeV, at a dose between about 1E15 to 1E16 atoms/cm$^2$.

13. The method of claim 10, wherein said P type region, located in said second portion of said polysilicon layer, is formed via ion implantation of boron, or $BF_2$ ions, at an energy between about 2 to 50 KeV, and at a dose between about 1E15 to 1E16 atoms/cm$^2$.

14. The method of claim 10, wherein said first silicon nitride layer is obtained via LPCVD or PECVD procedures, to a thickness between about 1500 to 3000 Angstroms.

15. The method of claim 10, wherein said insulator spacers, on the sides of said silicon nitride capped, polysilicon dual gate structure, are comprised of silicon oxide, or silicon nitride, at a thickness between about 1000 to 3000 Angstroms.

16. The method of claim 10, wherein said second silicon nitride layer is obtained via LPCVD or PECVD procedures, at a thickness between about 150 to 600 Angstroms.

17. The method of claim 10, wherein said ILD layer is a silicon oxide layer, or a borophosphosilicate glass layer, obtained via LPCVD or PECVD procedures, to a thickness between about 5000 to 15000 Angstroms.

18. The method of claim 10, wherein said borderless opening is formed in said ILD layer via a selective RIE procedure, using $CHF_3$ as an etchant.

19. The method of claim 10, wherein said metal plug structure is comprised of tungsten.

* * * * *